United States Patent [19]
Stevens et al.

[11] Patent Number: 5,130,774
[45] Date of Patent: Jul. 14, 1992

[54] ANTIBLOOMING STRUCTURE FOR SOLID-STATE IMAGE SENSOR

[75] Inventors: Eric G. Stevens, Rochester; Teh-Hsuang Lee, Webster; Bruce C. Burkey, Rochester, all of N.Y.

[73] Assignee: Eastman Kodak Company, Rochester, N.Y.

[21] Appl. No.: 551,963

[22] Filed: Jul. 12, 1990

[51] Int. Cl.$^5$ .................. H01L 29/78; H01L 27/14; H01L 31/00
[52] U.S. Cl. .................................. 357/24; 358/213.19
[58] Field of Search ............... 357/24 LR, 24 M, 24, 357/30 D, 30 H; 358/213.19

[56] References Cited

U.S. PATENT DOCUMENTS

| | | | |
|---|---|---|---|
| 3,896,474 | 7/1975 | Amelio et al. | 357/24 |
| 4,028,716 | 6/1977 | van Santen et al. | 357/24 |
| 4,593,303 | 6/1986 | Dyck et al. | 357/24 |
| 4,696,021 | 9/1987 | Kawahara et al. | 357/24 LR |
| 4,733,406 | 3/1988 | Kinoshita et al. | 377/61 |
| 4,743,778 | 5/1988 | Takatsu et al. | 358/213.19 |
| 4,907,050 | 3/1990 | Yamada | 357/24 LR |
| 4,914,493 | 4/1990 | Shiromizu | 357/24 LR |
| 4,975,777 | 12/1990 | Lee et al. | 358/213.19 |

FOREIGN PATENT DOCUMENTS 0059547 9/1982 European Pat. Off. .

OTHER PUBLICATIONS

"A Channel-Stop-Defined Barrier and Drain Antiblooming Structure for Virtual Phase CCD Image Sensors" by W. F. Keenan and Harold H. Hosack, IEEE Transactions on Electron Devices, vol. 36 No. 9, Sep., 1989, pp. 1634–1638.

Primary Examiner—Andrew J. James
Assistant Examiner—Ngan Van Ngo
Attorney, Agent, or Firm—Stephen C. Kaufman

[57] ABSTRACT

A solid-state image sensor includes a substrate of a semiconductor material of one conductivity type having a surface. A plurality of spaced, parallel CCDs are in the substrate at the surface. Each CCD includes a channel region of the opposite conductivity type in the substrate and a plurality of conductive gates extending across and insulated from the channel region. The conductive gates extend laterally across the channel regions of all of the CCDs and divide the channel regions into a plurality of phases and pixels. A drain region of the opposite conductivity type is in the substrate at the surface and extends along the channel region of at least one of the CCDs. A separate overflow channel region of the opposite conductivity type is in the substrate at said surface and extends from each of the CCD channel region phases to the adjacent drain region. A separate overflow barrier region of the one conductivity type is in the substrate and extends across an overflow channel region between the CCD channel region and the drain to control the flow of charge carriers from each phase of the CCD channel region to the drain. Each of the CCDs may have a separate drain region or two adjacent CCDs may share a common drain region. A CCD barrier region extends across the channel region in each phase. The CCD barrier region contains the same impurity concentration as the overflow-barrier region of its respective phase and may be connected to the overflow-barrier region.

18 Claims, 5 Drawing Sheets

ANTIBLOOMING STRUCTURE FOR SOLID-STATE IMAGE SENSOR

FIELD OF THE INVENTION

The present invention relates to a charge-coupled device (CCD) solid-state image sensor having an antiblooming structure, and, more particularly to a lateral overflow drain antiblooming structure for a CCD solid-state image sensor.

BACKGROUND OF THE INVENTION

Solid-state image sensors in general comprise photodetector means for detecting radiation from the image and converting the radiation to charge carriers, and transfer means for carrying the charge carriers to an output circuit. One type of solid-state image sensor uses a CCD as both the photodetector and the transfer means. The solid-state image sensor generally includes a plurality of the CCD's arranged in spaced parallel relation to form an area array. One problem which has arisen in this type of solid-state image sensor is known as "blooming." Blooming is a phenomenon that occurs when the number of charge carriers generated in a photodetector site by the incident radiation exceeds the storage capacity of the site. These excess charge carriers then spill over or "bloom" into adjacent photodetector sites thereby degrading, and in some cases, completely obliterating the integrity of the image.

To overcome this problem various antiblooming structures have been developed and used in the solid-state image sensors. One structure which has been used is a vertical-overflow drain which comprises a drain extending into the substrate in which the image sensor is formed into which the excess charge carriers flow and from which they are carried away. Although these vertical-overflow drains do prevent blooming, they often result in degradation of other performance aspects of the image sensor. For example, they can result in photoresponse nonlinearity (or soft turn-on), and reduced quantum efficiency and well bounce. In addition, the vertical-overflow drain structures heretofore used require more complicated processing which results in higher sensitivity to process variations. Lateral-overflow drain (LOD) structures have also been used in solid-state image sensors. However, they have not been used extensively in image sensors in which a CCD serves as both the photodetector and the charge transfer means. This is because LOD structures used to date on these types of image sensors have been extremely hard to manufacture due to processing sensitivity, e.g., U.S. Pat. No. 4,593,303 to R. H. Dyck et al or European Patent No. 0,059,547 to H. Hosack et al.

SUMMARY OF THE INVENTION

The present invention is directed to a solid-state image sensor comprising at least one CCD in a substrate of a semiconductor material. The CCD includes a channel region in the substrate and a conductive gate over and insulated from the channel region. An overflow-drain region is in the substrate and extends along the channel region of the CCD. A barrier region is in the substrate between the CCD channel region and the drain region. The conductive gate of the CCD extends over the barrier and drain regions. The barrier region allows the flow of excess charge carriers accumulated in the CCD channel region to overflow into the drain and thereby prevent blooming.

More particularly, the solid-state imager of the present invention comprises a substrate of a semiconductor material of one conductivity type having a surface. A channel region of the opposite conductivity type is in the substrate at the surface. An overflow drain of the opposite conductivity type is in the substrate at the surface and extends along the channel region. A barrier region of the one conductivity type is in the substrate and extends between the channel region and the overflow drain. A conductive gate is over and insulated from the channel region, the barrier region and the drain region.

The invention will be better understood from the following more detailed description taken with the accompanying drawings.

The drawings are not necessarily to scale.

DETAILED DESCRIPTION

Figure 1:
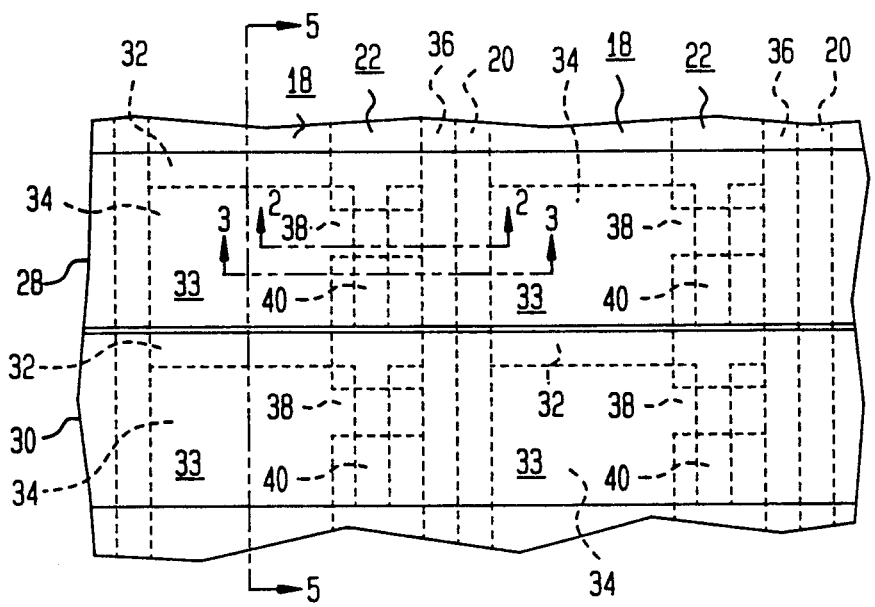
FIG. 1 is a top plan view of a portion of a solid-state image sensor of the present invention.
Figure 2:
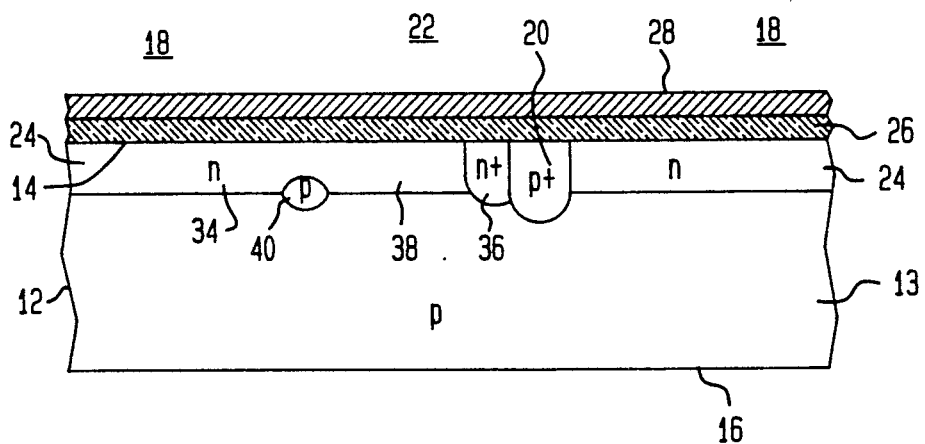
FIG. 2 is a sectional view taken along line 2—2 of FIG. 1.
Figure 3:
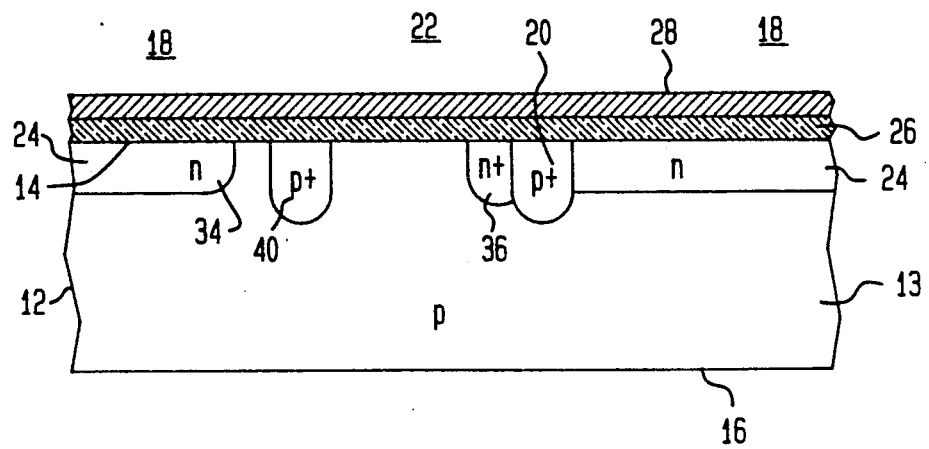
FIG. 3 is a sectional view taken along line 3—3 of FIG. 1.
Figure 5:
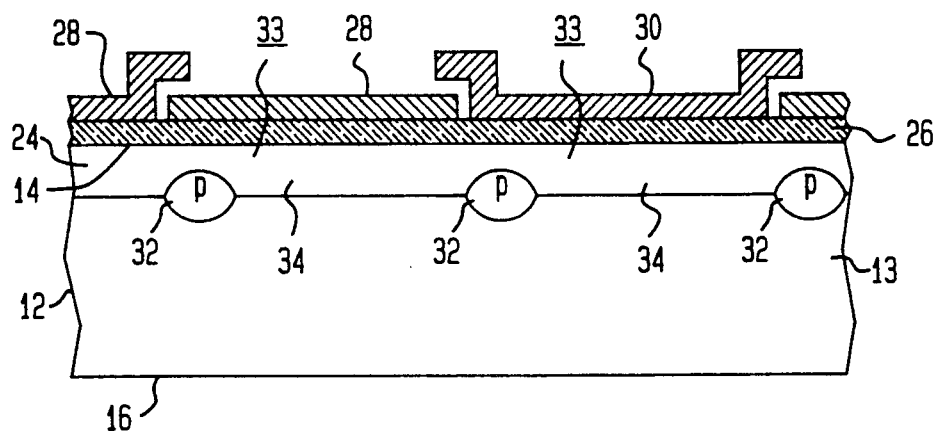
FIG. 5 is a sectional view taken along line 5—5 of FIG. 1.

Referring to FIGS. 1, 2, 3 and 5, there is shown a solid-state image sensor 10 in accordance with the present invention wherein FIG. 1 is a top plan view of a portion of the image sensor 10 and FIGS. 2, 3 and 5 are cross-sectional views taken through the dashed lines 2—2, 3—3 and 5—5, respectively in FIG. 1. The image sensor 10 comprises a substrate 12 of semiconductor material having a bulk portion 13 of one conductivity type (shown as p-type conductivity) of a semiconductor material, such as single-crystalline silicon. The substrate 12 has a pair of opposed major surfaces 14 and 16. A buried-channel region 24 (shown of n-type conductivity) of semiconductor material overlies a top surface of the bulk portion 13. Overlying region 24 is insulating layer 26 which separates conductive gates (conductors) 28 and 30 from surface 14. In the substrate 12 and along the surface 14 are a plurality of CCDs 18 arranged in spaced parallel relation. Although only a portion of two of the CCDs 18 are shown, the image sensor 10 can include any number of the CCDs 18 depending on the size of the image sensor. Between adjacent CCDs 18 is a channel stop 20 (shown as of p+ type conductivity), and between each CCD 18 and an adjacent channel stop 20 is a lateral-overflow antiblooming structure 22.

Figure 4:
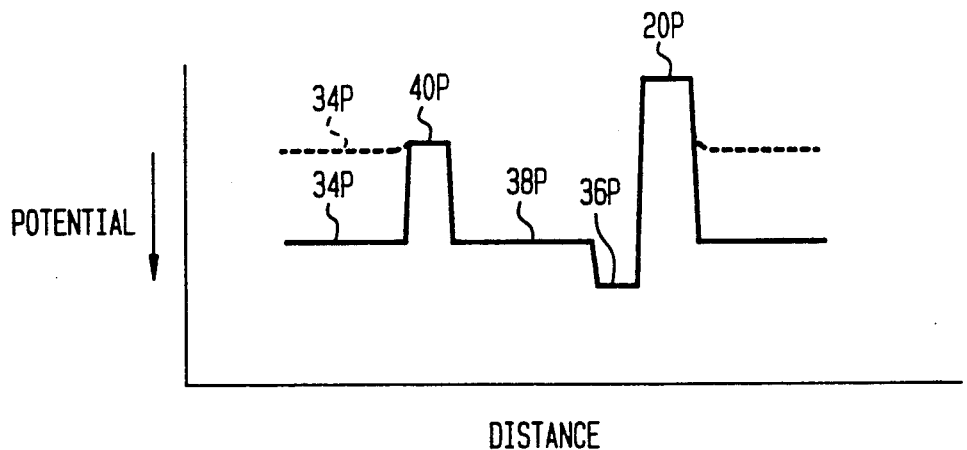
FIG. 4 is a diagram of the electrostatic potential in the substrate across the image sensor along the sectional view shown in FIG. 2.

Each CCD 18 comprises a portion of the buried-channel region 24 (shown as of n-type conductivity) which is of the opposite conductivity as the bulk portion 13. A first set of conductive gates 28 are on the insulating material layer 26 and extend laterally across the channel regions 24 of all of the CCDs 18. The first set of conductive gates 28 are spaced apart along the channel regions 24. A second set of conductive gates 30 are on the insulating material layer 26 and extend laterally across the channel regions 24 of all of the CCDs 18. Each of the second set of gates 30 is positioned between two of the first set of gates 28. The conductive gates 28 and 30 may be made of a transparent material, such as indium-tin oxide or doped polycrystalline silicon. A plurality of CCD channel barrier regions 32 (shown as p-type conductivity) of the same conductivity type as the bulk portion 13, extend laterally across each channel region 24. The barrier regions 32 are spaced along the channel region 24 with each barrier region 32 being directly beneath an end of a separate one of the conductive gates 28 and 30 as shown in FIG. 4, thus forming a two-phase CCD. The conductive gates 28 and 30 divide each channel region 24 into a plurality of pixels with the portion of the channel region 24 under each pair of adjacent conductive gates 28 and 30 being a separate pixel. The portions of the channel region 24 under the conductive gates 28 and 30 form phase 1 and phase 2, each referred to as 33, of a pixel. Each phase 33 comprises a CCD channel barrier region 32 and a storage region 34.

Each of the channel stops 20 is a highly conductive region (shown as p+ type conductivity) of the same conductivity type as the bulk portion 13. The channel stops 20 extend from surface 14 completely through region 24 and into the bulk portion 13. The channel stops 20 extends along the substrate 12 for the full length of the CCDs 18.

The antiblooming structure 22 comprises a highly conductive drain region 36 (shown as n+ type conductivity) of a conductivity type opposite that of the bulk portion 13. The drain region 36 extends from surface 14 into the bulk portion 13 and along a channel stop 20. An overflow-channel region 38 of the same conductivity type as the buried-channel region 24 is adjacent each phase 33 of the CCD channel region 24. Each of the overflow-channel regions 38 extends from the storage region 34 of its adjacent phase 33 to the drain region 36. Preferably, each overflow-channel region 38 extends from only a small portion of the length of its adjacent storage region 34. An overflow-barrier region 40 (shown as of p-type conductivity), which is of the same conductivity type as the bulk portion, extends into the bulk portion 13 and is located between a phase 33 and drain region 36. An overflow-channel region 38 and an overflow-barrier region 40 are formed in each phase 33 so that the device may be run with the gates clocked in accumulation. As shown in FIG. 1, each of the overflow barrier regions 40 is an extension of the CCD channel barrier region 32 of its respective phase 33. However, the length of each overflow barrier 40, i.e., the distance across the overflow barrier 40 in the direction of the CCD channel region 24 to the drain 36, is shorter than the length of the CCD channel barrier region 32, i.e., the distance across the CCD channel barrier region 32. This insures that no blooming will occur since the excess photocurrent will go into the drain instead of along the CCD channel region 24 due to a deeper channel potential under the overflow-barrier region 40 than under the CCD channel barrier region 32. In the image sensor 10 shown in FIG. 1, all of the lateral overflow antiblooming structures 22 are on the same side of each of the CCD channel regions 24. This embodiment of the solid-state image sensor 10 has a lower fill factor, but has a higher modulation transfer function (MTF).

To make the image sensor 10, all of the various regions are formed in a p-type conductivity substrate 12 having an impurity concentration of about $10^{15}$ impurities/cm$^3$. The various regions are preferably formed by ion implanting the appropriate impurities into the substrate 12. The n-type CCD channel region 24 and the n-type overflow channels 38 are formed simultaneously by the same implantation step and each have an impurity concentration of about $10^{17}$ impurities/cm$^3$. Likewise, the p-type conductivity CCD channel barriers 32 and the p-type conductivity overflow barriers 40 are preferably formed simultaneously by the same implantation step and each have an impurity concentration of about $10^{16}$ impurities/cm$^3$. Forming the overflow barriers 40 and the CCD channel barriers 32 by the same implantation step is preferred since it helps eliminate process sensitivity by insuring that maximum charge capacity is obtained without blooming. However, the overflow barriers 40 and the CCD channel barriers 32 can be formed by separate implantation steps as long as both regions contain substantially the same impurity concentration. The n+ type drain 36 and the p+ type channel stop 20 each have an impurity concentration of about $10^{18}$ impurities/cm$^3$.

Figure 6:
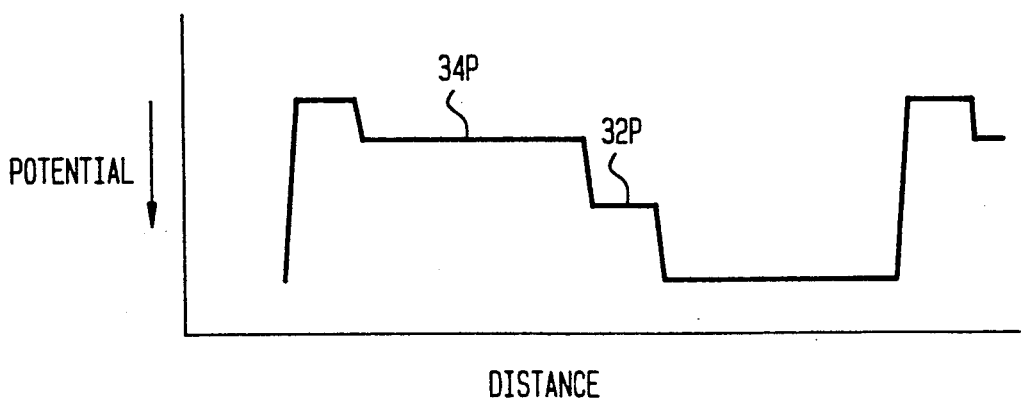
FIG. 6 is a diagram of the electrostatic potential in the substrate across the image sensor along the sectional view shown in FIG. 5.
Figure 8:
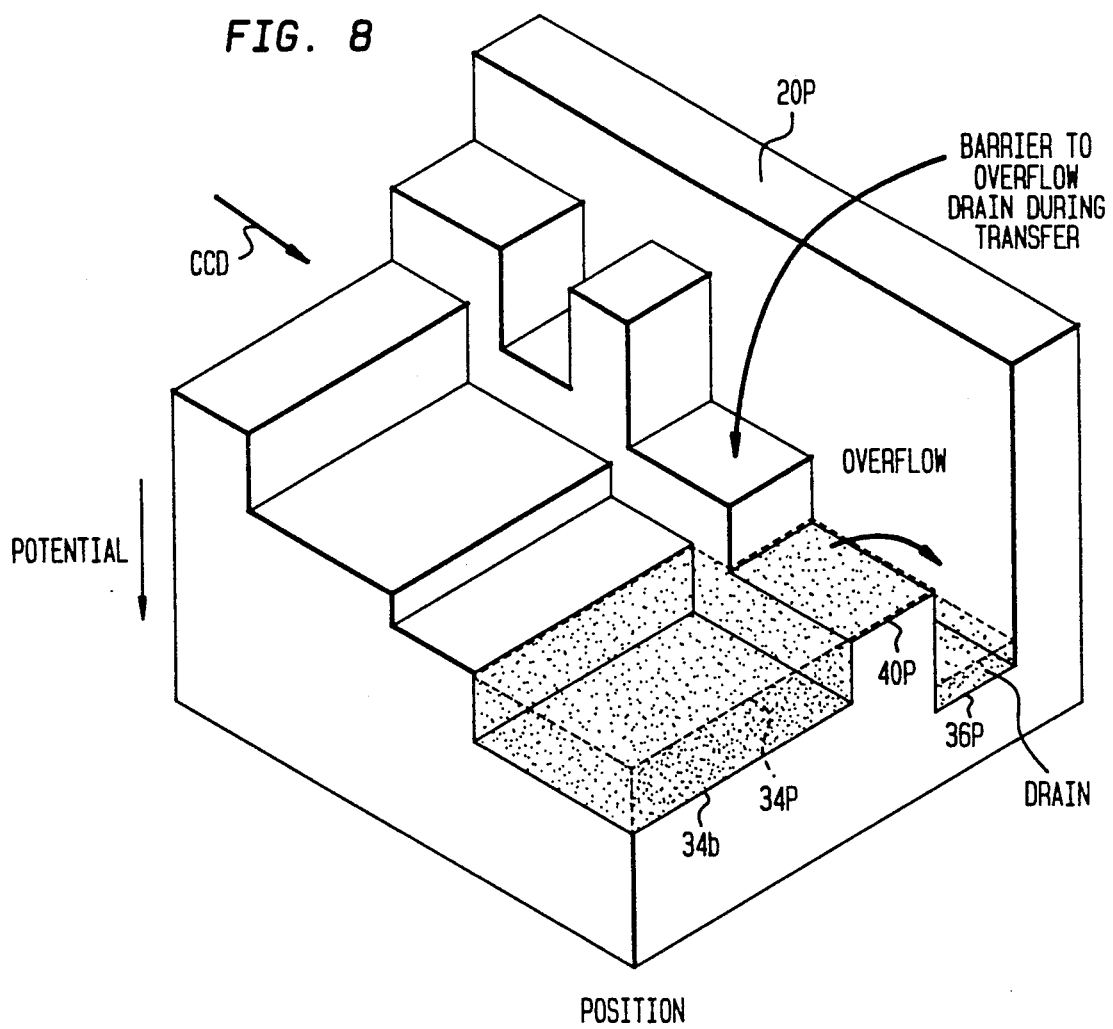
FIG. 8 is a three-dimensional illustration of the electrostatic potential in the image sensor of the present invention during its operation.

Referring now to FIGS. 4 and 6, there are shown electrostatic potentials (on the y-axis) versus distance (on the x-axis) along the image sensor 10 during its operation. FIG. 4 shows the potentials along the cross-section shown in FIG. 2; and FIG. 6 shows the potentials along the cross-section shown in FIG. 5. Referring now to FIG. 8, there is shown a three dimensional view of the potentials on the y-axis in the entire device with length shown on the x-axis and width shown on the z-axis for a particular set of clock voltages. At the start of the integration step when the image sensor 10 receives radiation from the image being sensed, the potential 34P in the CCD channel storage region 34 of each phase 33 is high. As the radiation is converted to charge carriers in each storage region 34, the potential 34P decreases until it reaches the level of the dash lines in FIGS. 4 and 8. At this point the potential 34P in the channel storage region 34 is essentially as low as the potential 40P of the respective overflow barrier 40. Any additional charge carriers formed in each channel storage region 34 will cause the charge carriers to flow over the antiblooming barrier 40 and into the drain 36, which is at a higher potential 36P. The low potential 20P in the channel stop 20 prevents the flow of charge carriers between the drain 36 and the next adjacent CCD channel storage regions 34.

During the transfer step, a voltage is applied to the second set of CCD conductive gates 30. This causes the potential 32P of the barrier region 32 under the second set of gates 30 to become higher than the potentials 34P in the storage regions 34 under the first set of gates 28 as shown in FIG. 6. This allows the charge carriers in the storage region 34 under the first set of gates 28 to flow across the barrier region 32 into the storage region 34 under the second set of gates 30. The voltage is then removed from the second set of gates 30 and applied to the first set of gates 28. This increases the potential of the barrier regions 32 under the first set of gates 28 to a level above the potential in the storage region 34 under the second set of gates 30 and thereby allows the charge carriers to flow from the storage regions under the second set of gates 30 to the storage regions 34 under the first set of gates. During the flow of the charge carriers from one gate to the next, charge is prevented from spilling into the overflow drains by the barrier regions 40. By clocking the voltages back and forth between the two sets of gates 28 and 30, the charge carriers are moved along the CCDs to an output circuit, not shown, at the ends of the CCDs.

Figure 9:
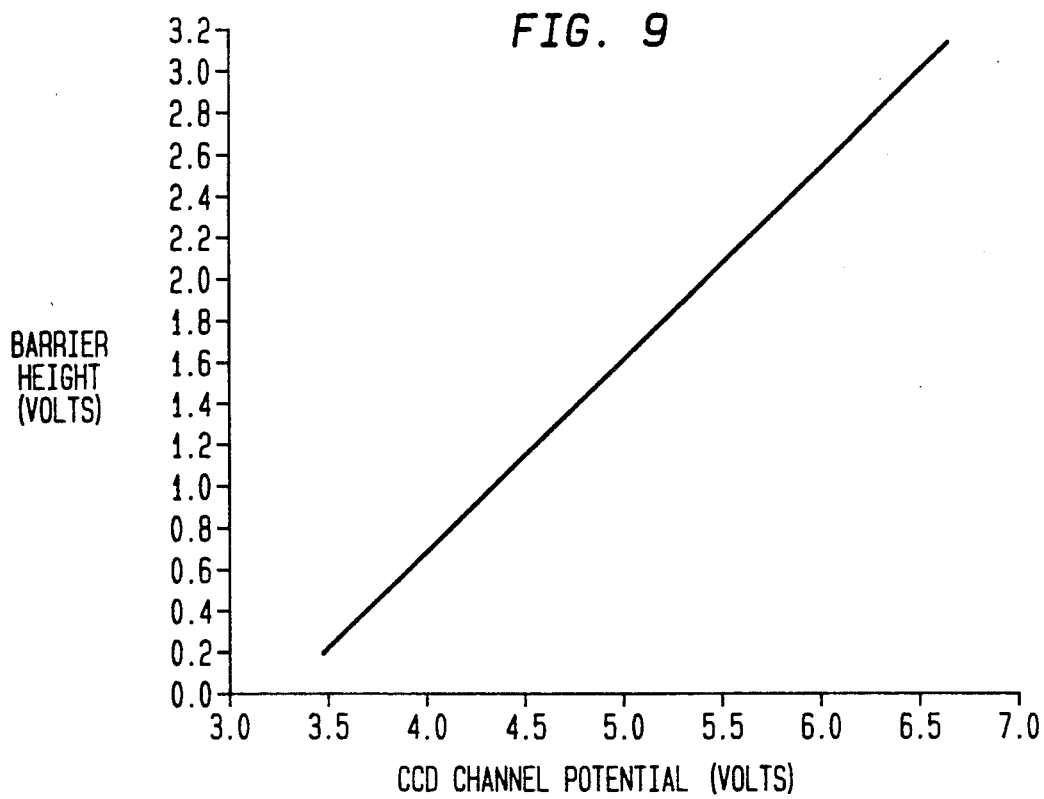
FIG. 9 is a diagram of the lateral-overflow barrier height vs. the CCD channel potential for the image sensor of the present invention.

Referring now to FIG. 9, there is shown an electrostatic simulation of the barrier height (volts on the y-axis) between the CCD storage region and the LOD versus the channel potential (volts on the x-axis) of the CCD storage region 34. The linearity of this plot indicates that this LOD structure will not degrade the image sensor's photoresponse linearity. The reciprocal of the slope of this curve is defined as the non-ideality factor. From this curve the non-ideality factor is about 1.1, which indicates a sharp antiblooming turn-on and good photoresponse linearity.

Figure 10:
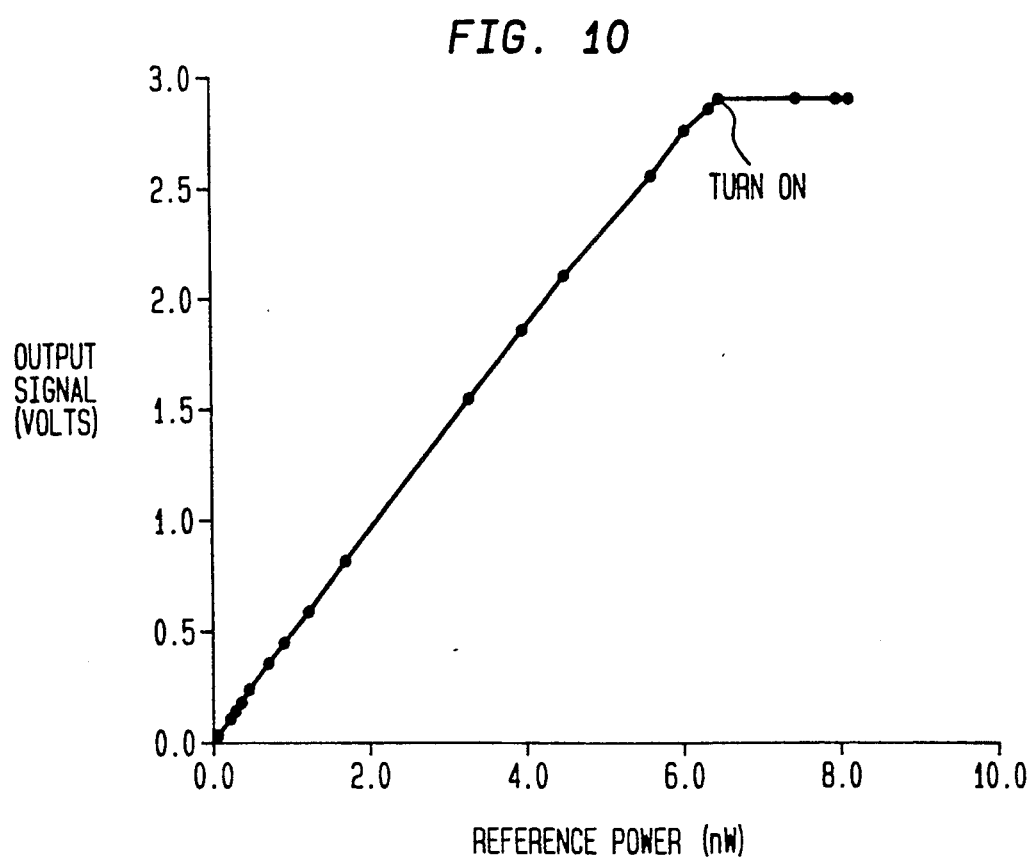
FIG. 10 is a diagram of the output signal vs. the reference power for the image sensor of the present invention showing its photoresponse.

Referring now to FIG. 10, the measured photoresponse of the image sensor 10 of the present invention is shown graphically. From this graph, which shows an output signal (volts) on the y-axis versus reference power (nW) on the x-axis, it can be seen that excellent linearity is maintained, and an extremely sharp turn-on results.

Figure 11:
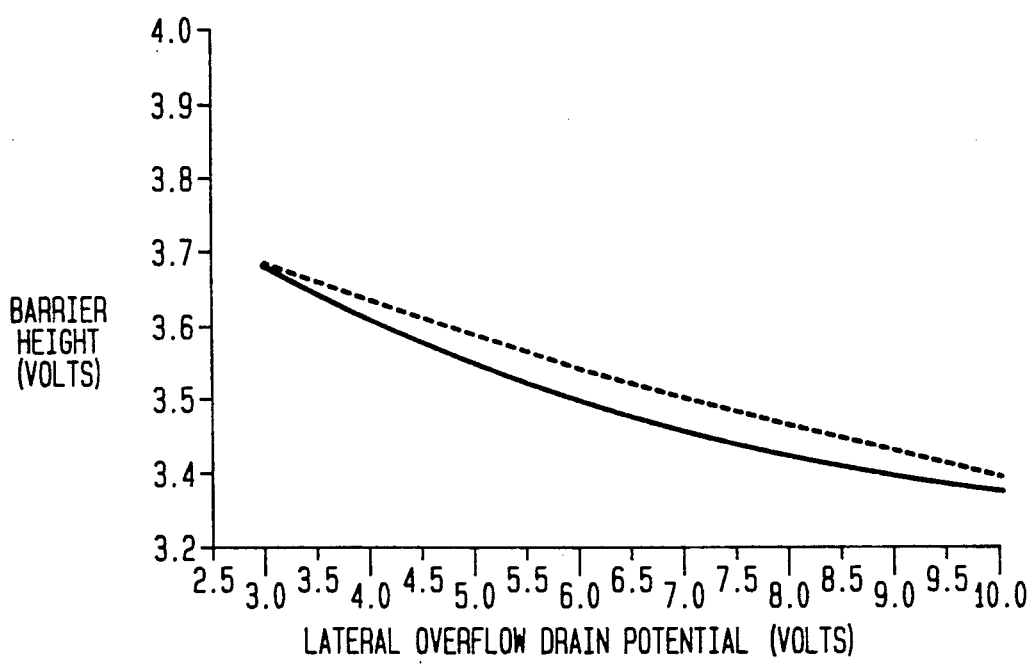
FIG. 11 is diagram showing the measured and calculated barrier height vs. the lateral overflow drain's potential for the image sensor of the present invention.

Referring now to FIG. 11, there is graphically shown the measured (dashed line) and calculated (solid line) barrier height (in volts on the y-axis) versus the lateral overflow drain's potential (in volts on the x-axis). From FIG. 10 it can be seen that the overflow point is very insensitive to variation of the drain voltage. This has long been a problem with other antiblooming structures, particularly vertical overflow structures. This insensitivity in barrier height is also due, in part, to the lightly doped overflow-channel regions 38 shown in FIG. 2 which reduce drain induced barrier lowering.

Figure 7:
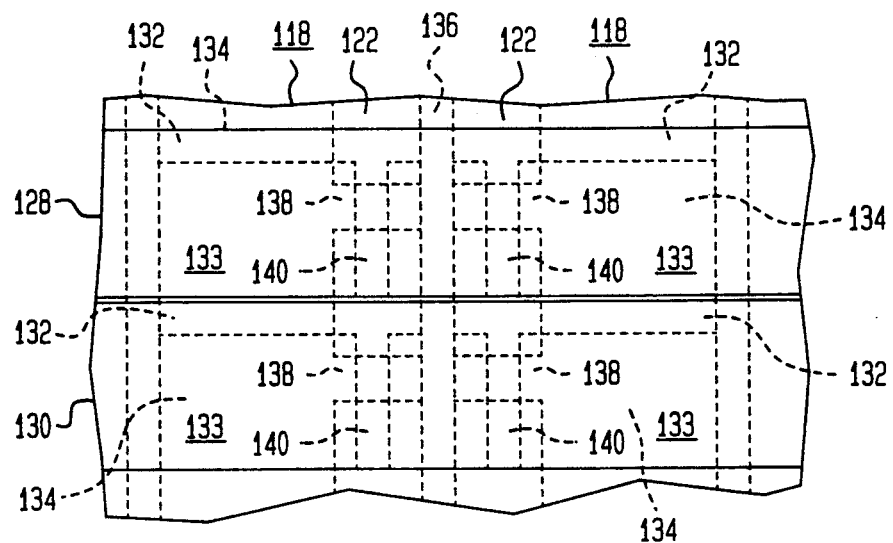
FIG. 7 is a top plan view of a portion of a modification of the image sensor of the present invention.

Referring now to FIG. 7, there is shown a top plan view of an image sensor 100 in accordance with the present invention. The image sensor 100 is similar in structure to the image sensor 10 of FIG. 1 and the same reference numbers are used for similar portions with a "1" added in front thereof. Image sensor 100 does not include a channel stop between adjacent rows of the CCDs 118 and the antiblooming structures 122 of adjacent CCDs 118 share a common drain region 136. An overflow channel 138 extends from the storage region 134 of each phase 133 of the CCD channel region 124 with the overflow channels 138 of the CCDs 118 at opposite sides of the drain 136 extending toward the same drain 136. An overflow barrier 140 extends across each overflow channel 138 between its respective CCD channel 124 and the drain 136 and is connected to a CCD channel barrier 132 which extends across the CCD channel region 124 under each conductive gate 128 and 130. The image sensor 100 operates in the same manner as the image sensor 10 shown in FIG. 1 except that the antiblooming structures of adjacent CCDs share a common drain. A channel stop is provided between the sides of adjacent CCDs where there is no antiblooming structure. This structure offers a higher fill factor since a single drain is shared by two CCDs, but has more cross talk between the CCDs not separated by a drain.

Thus, there is provided by the present invention a solid-state image sensor having a plurality of CCDs, each of which serves to collect the imaging radiation and convert the radiation to charge carriers, and to transfer the charge carriers to an output circuit. The CCDs are provided with a lateral-overflow drain which serves as an antiblooming structure. The lateral-overflow drain structure improves the modulation transfer function (MTF) and reduces horizontal crosstalk of the image sensor as a result of the collection of laterally diffusing photocarriers. The lateral-overflow drain is very insensitive to variations in the drain voltage. Also it provides the image sensor with good linearity and sharp turn-on.

It is to be appreciated and understood that the specific embodiments of the invention are merely illustrative of the general principles of the invention. Various modifications may be made consistent with the principles set forth. For example, although the image sensor has been described as being made in a substrate of single crystalline silicon, the substrate can be of any other suitable semiconductor material. Still further, although the substrate has been described as being of p-type conductivity and the channel regions being of n-type material, the image sensor can be made in a substrate of n-type conductivity semiconductor material, with the conductivity of the other parts of the image sensor being reversed from that described. Still further, although the channel-stops are described as being of highly conductive regions, other types of channel-stops may be used, such as depletion isolation channel-stops. Furthermore, the structure of the present invention can be used with a virtual-phase CCD device.

What is claimed is:

1. A solid-state image sensor comprising:
    a substrate of a semiconductor material of one conductivity type having a surface;
    a CCD-channel region of the opposite conductivity type in said substrate at said surface;
    an overflow-drain region of the opposite conductivity type in said substrate at said surface and extending along said CCD-channel region;
    an overflow-channel of the opposite conductivity type in said substrate at said surface and extending from the CCD-channel region toward the overflow drain region;
    an overflow-barrier region of the one conductivity type in said substrate and extending transversely across a portion of the overflow-channel region between the CCD-channel region and the drain region; and
    a conductive gate over and insulated from the CCD-channel region, overflow-channel and the overflow-barrier region.

2. The solid-state image sensor of claim 1 further comprising a plurality of overflow channel regions in said substrate and extending from the CCD-channel region toward the drain region, said overflow channel regions being spaced apart from each other along the CCD-channel region, a separate overflow-barrier region is in the substrate and extends across each of the overflow-channel regions, and a separate conductive gate extends across each of the overflow-channel regions and overflow-barrier regions with each of the gates extending across a separate overflow-barrier region.

3. The solid-state image sensor of claim 2 further comprising a plurality of CCD-barrier regions of the one conductivity type in said substrate and extending across the CCD-channel region, each of said CCD-barrier regions being under a separate one of said conductive gates.

4. The solid-state image sensor of claim 3 in which each of said CCD-barrier regions contains an impurity of a given concentration and the overflow-barrier region under the same conductive gate has a net impurity concentration substantially the same as the net impurity concentration of the CCD-barrier regions.

5. The solid-state image sensor of claim 4 in which the CCD-barrier region and the overflow-barrier region under the same conductive gate are formed by a common implantation.

6. The solid-state image sensor of claim 4 in which each of said CCD-barrier regions is connected to the overflow-barrier region under the same conductive gate.

7. The solid-state image sensor of claim 4 in which the length of each of the overflow-barrier regions in the direction from the CCD-channel region to the drain region is less than the length of the CCD-barrier region in the direction along the CCD-channel region.

8. A solid-state image sensor comprising:
a substrate of a semiconductor material of one conductivity type having a surface;
a plurality of CCD-channel regions of the opposite conductivity type in said substrate at said surface, said CCD-channel regions extending along said substrate surface in spaced parallel relation;
a separate drain region of the opposite conductivity type in said substrate and extending along said surface adjacent at least one of said CCD-channel regions;
a plurality of conductive gates extending laterally across said CCD-channel regions and insulated from said substrate surface, said conductive gates being positioned along said CCD-channel regions and defining the CCD-channel regions into a plurality of phases and pixels along the CCD-channel regions;
a separate overflow-channel region of the opposite conductivity type in said substrate at said surface and extending from each phase of the CCD-channel regions toward the adjacent drain region; and
a separate overflow barrier region of the one conductivity type in said substrate under each of said conductive gates and extending transversely across a portion of said overflow-channel region between each phase of each CCD channel region and an adjacent drain region.

9. The solid-state image sensor of claim 8 further comprising a separate CCD-barrier region of the one conductivity type in said substrate and extending transversely across each phase of each CCD-channel region.

10. The solid-state image sensor of claim 9 in which each of the CCD-barrier regions extends along an edge of the conductive gate in its respective phase portion of the CCD-channel region.

11. The solid-state image sensor of claim 10 in which each of said CCD-barrier regions and the overflow-barrier region which are under the same conductive gate each contain an impurity with the net impurity concentration in each being substantially the same.

12. The solid-state image sensor of claim 11 in which the CCD-barrier region and the overflow-barrier region under the same conductive gate are formed by a common implantation.

13. The solid-state image sensor of claim 10 in which each of the CCD-barrier regions is connected to the overflow-barrier region of its respective phase.

14. The solid-state image sensor of claim 10 in which the length of each of the overflow-barrier regions in the direction from the CCD-channel region to the drain region is less than the length of the respective CCD-barrier region in the direction along the CCD channel region.

15. The solid-state image sensor of claim 8 in which there is a separate one of said drain regions adjacent each of the CCD-channel regions and between adjacent CCD-channel regions, and the overflow-drain regions all extend in the same direction from their respective CCD-channel regions to an adjacent drain region.

16. The solid-state image sensor of claim 15 further comprising a highly conductive channel-stop region of the one conductivity type in said substrate at said surface and extending along each of said drain regions between the said drain region and the adjacent CCD-channel region which does not have overflow-channel regions extending to the respective drain region.

17. The solid-state image sensor of claim 8 in which there is a drain region between and common to adjacent CCD-channel regions and the overflow-channel regions of said adjacent CCD-channel regions extend toward the common drain region.

18. A solid-state image sensor comprising:
a substrate of a semiconductor material of one conductivity type having a surface;
a CCD-channel region of the opposite conductivity type in the substrate and extending to the surface;
an overflow-drain region of the opposite conductivity type in the substrate and extending to the surface and extending along the CCD-channel region;
a plurality of conductive gates extending laterally across the CCD-channel region and insulated from the substrate surface, said conductive gates being positioned along the CCD-channel region and defining the CCD-channel region into a plurality of phases and pixels along the CCD-channel region;
a separate overflow-channel region of the opposite conductivity type in the substrate and extending to the surface and extending from each phase of the CCD-channel region toward the overflow-drain region; and
a separate overflow-barrier region of the one conductivity type in the substrate and under each of the conductive gates and extending transversely across a portion an overflow-channel region between a phase of the CCD-channel region and the overflow-drain region.

* * * * *

UNITED STATES PATENT AND TRADEMARK OFFICE
CERTIFICATE OF CORRECTION

PATENT NO. : 5,130,774
DATED : July 14, 1992
INVENTOR(S) : Eric G. Stevens, Teh-Hsuang Lee and Bruce C. Burkey It is certified that error appears in the above-identified patent and that said Letters Patent is hereby corrected as shown below:

```
Column 7, line 7, after "extending", insert -- transversely --.
Column 8, line 37, "said" should read -- each of the --.
```

Signed and Sealed this

Twenty-first Day of September, 1993

Attest:

BRUCE LEHMAN

Attesting Officer     Commissioner of Patents and Trademarks

UNITED STATES PATENT AND TRADEMARK OFFICE
CERTIFICATE OF CORRECTION

PATENT NO. : 5,130,774
DATED : July 14, 1992
INVENTOR(S) : Eric G. Stevens, Teh-Hsuang Lee, Bruce C. Burkey It is certified that error appears in the above-indentified patent and that said Letters Patent is hereby corrected as shown below:

Column 4, line 50:

After "region 34" delete "of each phase 33" and insert -- beneath each conductive gate 28 --.

Signed and Sealed this

Eighth Day of October, 1996

Attest:

BRUCE LEHMAN

Attesting Officer     Commissioner of Patents and Trademarks